United States Patent [19]

Middlestadt

[11] Patent Number: 4,645,545
[45] Date of Patent: Feb. 24, 1987

[54] SHAPE RETAINING BODIES OF SOLDER CONTAINING FLUX AND THEIR METHOD OF MANUFACTURE AND USE

[76] Inventor: Louis Middlestadt, 90 Fisherville Ave., Apt. 505, Willowdale, Ontario, Canada, M2R 3J9

[21] Appl. No.: 758,119

[22] Filed: Jul. 23, 1985

[51] Int. Cl.[4] .................................. B23K 35/34
[52] U.S. Cl. ........................................ 148/24
[58] Field of Search ................................ 148/24

[56] References Cited

U.S. PATENT DOCUMENTS

| | | | |
|---|---|---|---|
| 3,486,948 | 12/1969 | Laubmeyer | 148/24 |
| 3,745,077 | 7/1973 | Jones | 148/24 |
| 3,866,015 | 2/1975 | Matsumoto | 148/24 |
| 4,436,562 | 3/1984 | Tokuhisa | 148/24 |
| 4,487,638 | 12/1984 | Hoge | 148/24 |

Primary Examiner—Peter D. Rosenberg
Attorney, Agent, or Firm—Fetherstonhaugh & Co.

[57] ABSTRACT

Solid shape retaining bodies of solder containing flux are manufactured by mixing a predetermined quantity of solder in a dry particulate form with a predetermined quantity of a complimentary solder flux in dry particulate form to form a homogeneous mixture and then compressing a quantity of the homogeneous mixture to form a solid body having a predetermined shape. The solderable body which is produced is in the form of a solid shape retaining body which comprises a homogeneous mixture of solder particles and flux particles. A solder joint is formed by locating the solid preformed body at an interface and heating the body to effect soldering of the solderable components at the interface.

9 Claims, 10 Drawing Figures

SHAPE RETAINING BODIES OF SOLDER CONTAINING FLUX AND THEIR METHOD OF MANUFACTURE AND USE

This invention relates to solid shape retaining bodies of solder containing flux and their method of manufacture.

Solders and flux bearing solders have been used to form joints between components for many years.

It is well known that a flux is required in order to ensure that the solder will adhere adequately to the surface to which it is applied. Difficulty has long been experienced in attempting to ensure that the flux is available at the body to which the solder is applied.

It has been common practice for many years to form solder into wire and to provide the flux as a coaxial core in the wire. From time to time, such a wire has been shaped to the configuration of the interface between two components which are to be soldered so that the shaped wire can be positioned to overlie the point at which the solder connection is to be made. In this form, however, the flux is remote from the point of contact with the surfaces of the components which are to be connected and is not available until after their has been a substantial melting of the solder jacket by which time the effectiveness of the flux is substantially reduced.

Because of these deficiencies in the forming of pre-shaped solid bodies of solder, it has been common practice to prepare a solder/flux mixture in a liquid form which can be printed or otherwise applied to this joint area. While liquid or paste solders containing flux are effective in many applications, there are other applications in which liquid and paste cannot be effectively used because the equipment does not lend itself to the application of a coating by a screening or printing process. Screening or printing can only be effectively carried out when the surface to which the flux is to be applied is a substantially flat surface. In many applications, however, it is necessary to make a solder joint on a control panel on which a substantial number of other electronic components have been previously mounted and in such circumstances, it is not possible to effectively use a screen printing process.

U.S. Pat. No. 4,298,407 discloses a method of preparing a flux treated solder powder composition in which a solder alloy powder composition is mixed with a flux composition until the solder particles are coated with a coating of the flux. The solder compositions of Taylor are either in particulate, or paste form. The mixing of the flux and solder alloys carried out until the alloy particles are coated with a thin continuous layer of organic flux sufficient to lower the electrical conductivity and to obscure the eutectic domains on the surface of the alloy particles. Tayler is therefor concerned with the mixing of a tin alloy solder powder with a flux in order to produce solder compositions in a particulate form or in a paste form. The object of the mixing is to ensure coating of the alloy particles with the continuous layer of flux.

It is an object of the present invention to provide a preformed solid solderable body which comprises a homogeneous mixture of solder and flux. It is a further object of the present invention to provide a method of forming a preformed solid solderable body which comprises a homogeneous mixture of solder alloy and flux.

According to one aspect of the present invention, a method of forming a solid shape retaining body of solderable material comprises the steps of mixing a predetermined quantity of a solder in the form of dry finely divided metal particles with a predetermined quantity of a complementary solder flux in dry particles to form a homogeneous mixture, compressing a quantity of said homogeneous mixture to form a solid body having a predetermined shape.

According to a further aspect of the present invention, a solderable body comprises a solid shape retaining body comprising a homogeneous mixture of solder particles and flux particles.

It is a further object of the present invention to form a solder joint at an interface between two solderable components which includes the step of mixing a predetermined quantity of a solder in the form of dry finely divided metal particles with a predetermined quantity of a complementary solder flux in a dry particulate form to form a homogeneous mixture, compressing a quantity of said homogeneous mixture to form a solid body having a configuration matching said predetermined shape of said solder sites, locating said solid body at said interface, and heating said solid body to effect soldering of said solderable components at said interface.

The invention will be more clearly understood after reference to the following detailed specification read in conjunction with the drawings wherein.

Figure 1:
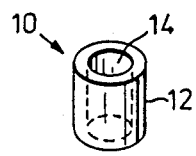
FIG. 1 is pictorial view of a solid body of solderable material having a hollow cylindrical configuration.

With reference to FIG. 1 of the drawings, the reference numeral 10 refers generally to a solid body which consists of a mixture of solder alloy and a complementary flux. The body 10 is in the form of a hollow cylindrical sleeve 12 having a central bore 14.

Figure 2:
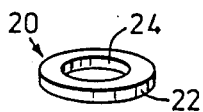
FIG. 2 is a pictorial view of solid body of solderable material having a flat ring configuration.

In FIG. 2, the reference numeral 20 refers generally to a solid body which consists of a flat ring 22 which has a central bore 24.

Figure 3:
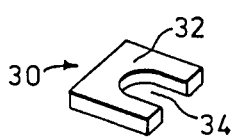
FIG. 3 is a pictorial view of a solderable body having a generally U-shaped configuration, and, FIG. 4 is a pictorial view of a solid body of solderable material having an irregular configuration.

In FIG. 3, the solid body 30 is in the form of a U-shaped body 32 having a U-shaped notch 34 formed therein.

Figure 4:
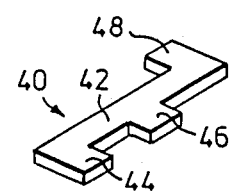

In FIG. 4, the body 40 comprises a flat elongated body portion 42 which has lugs 44, 46 and 48 projecting laterally therefrom.

In order to form the solid bodies 10, 20, 30 and 40 into a solid shape retaining configuration, a quantity of a solder alloy in the form of dry finely divided metal particles, preferably in the form of a dry powder, is initially prepared. Preferably, the dry powder particles are of a particle size in the range of 80 to 300 American Standard Mesh. Typical solder powder alloys may be tin containing solder alloys such as tin/lead, tin/silver and tin/lead/antimony or tin/antimony. In addition, a complementary solder flux is prepared in a dry powder form. The particle size of the powder of the flux is preferably in the range of 80 to 300 American Standard Mesh. Suitable flux compositions which may be prepared in powder form are rosin and/or resins with suitable activators such as aniline hydrochloride, diamethylamine hydrochloride, hydrozine mono hydrobromide, urea or the acid fluxes such as the aromatic acids, carboxylic acids, salicylic acid, sucinic acids and triethanolamine or the like.

A predetermined quantity of a solder in dry powder form is then mixed with a predetermined quantity of a complementary solder flux in a dry particulate form such as a dry powder form to form a homogeneous mixture. Preferably, the mixture contains flux in the range of 0.25% to 30% by weight of the solder powder.

Figure 5:
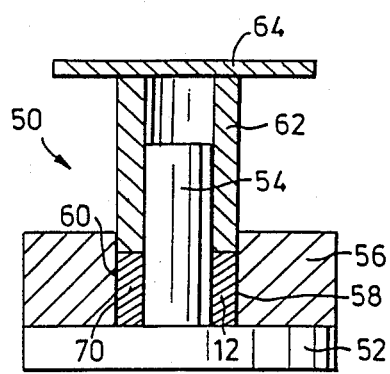
FIG. 5 is a sectional side view of a press illustrating the manner of manufacture of a solid body such as that of FIG. 1.

The homogeneous mixture is then compressed in a suitable compression device such as that illustrated in FIG. 5 of the drawings to the required solid body configuration. The nature of solder alloys is such that the powdered particles of solder can be welded to one another by the application of pressure to form a solid body in which the flux particles are evenly distributed therethrough. By forming this solid body containing flux particles, flux particles will be retained at the surfaces of the body with the result that the flux is available for immediate fluxing of the solder site.

With reference to FIG. 5 of the drawings, it will be seen that a suitable press 50 for use in forming the cylindrical body 12 may comprise a base 52 which has a post 54 projecting upwardly therefrom. A dye 56 which has a cylindrical passage 58 is mounted on the base 52 in a conventional manner to form an annular compression chamber 60 surrounding the post 54. A cylindrical shaped compression member 62 is mounted on a top plate 64 and extends into the compression chamber. When the predetermined quantity 70 of the homogeneous mixture of solder and flux is located in the chamber 60, the tubular sleeve member 62 is moved downwardly in the direction of the arrow A into the chamber 60 to compress the mixture 70 to form a solid body which can thereafter be removed by lowering the base 52 to withdraw the post 54 from the sleeve 62.

Figure 6:
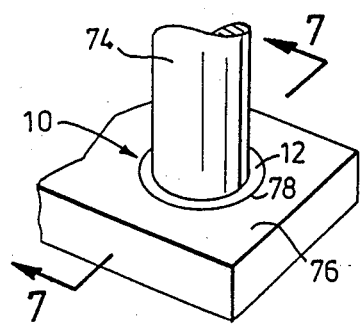
FIG. 6 is a pictorial view of two solderable components showing the location of the solid body of FIG. 1.
Figure 7:
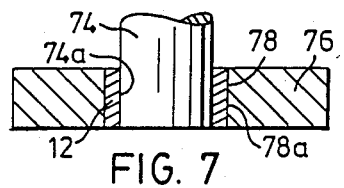
FIG. 7 is a sectional view taken along the lines 7—7 of FIG. 6.

As shown in FIGS. 6 and 7 of the drawings, the solid body 10 may be used to form a solder joint between a rod 74 and a plate 76 formed with a through passage 78. In this embodiment, the sleeve 12 is located between the rod 74 and the wall of the passage 78 and is heated after fitting to form the required soldered joint. It will be apparent that by reason of the fact that the flux is dispersed through the solid body of the sleeve 12, flux is available along the full length of the cylindrical shaped solder sites 78A and 74A of the bore 78 and rod 74 respectively.

Figure 8:
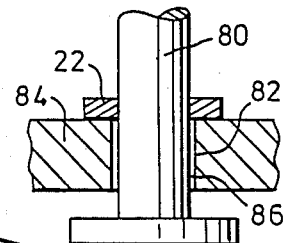
FIG. 8 is a sectional view similar to FIG. 7 showing the use of a solid body of the configuration of FIG. 2.
Figure 9:
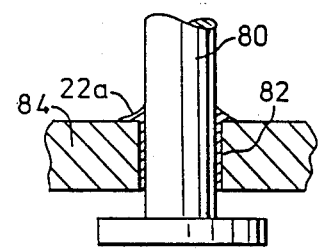
FIG. 9 is a sectional side view of the components of FIG. 1 showing the soldered joint formed by heating the solid body of FIG. 8.

In the embodiment illustrated in FIGS. 8 and 9 of the drawings, the flat ring 22 of FIG. 2 is located as a caller extending around a rod 80 which projects through a passage 82 in a plate 84. Upon heating, the solid body 20 will melt and flow into the passage 86 and assume the configuration illustrated in FIG. 9 forming a solder joint between the rod 80 and the plate 84.

Figure 10:
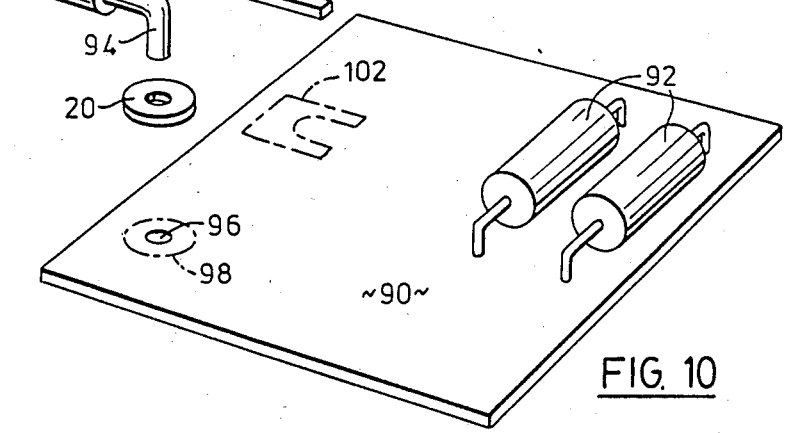
FIG. 10 is a diagrammatic plan view showing a panel on to which a number of different electronic components are soldered.

FIG. 10 illustrates a control panel 90 upon which a plurality of electronic components 92 are mounted and which project upwardly therefrom. Because these components are mounted on the control panel 90, it is not convenient to apply a printed overlay of a solder paste with the result that when it is necessary to make solder connections, the solid shape retaining bodies of solderable material such as those illustrated in FIGS. 1 to 4, can be used to advantage. When it is necessary to mount a wire 94 in a passage 96, the solid body 20 may be threaded over the wire 94 and the wire 94 then inserted into the passage 96 to locate the solid body 20 at the solder site 98. Similarly, when it is necessary to connect a Y-shaped connection 100 to a solder site 102, the U-shaped solid body 30 of solderable material may be positioned at the solder site 102 and the solid body 100 placed on the solid body 30. The joint being formed by heating the solder site.

The solder may be lead, zinc alloys, solder braising alloys, gold and silver solders and any type of solder that can be prepared in the form of dry finely divided metal particles including powders, granules or flakes, and for which the required flux can also be prepared in a dry particulate form such as powder, flakes or granules. Other additions such as flux salts and other active inorganic agents may be included in the flux powder. Various modifications of the present invention will be apparent to those skilled in the art without departing from the scope of the invention.

The embodiments of the invention in which an exclusive property or privilege is claimed are defined as follows:

1. A method of forming a free standing body of self-fluxing solderable material into a predetermined shape which is complementary in shape to a solder site comprising the steps of:
   (a) mixing a predetermined quantity of dry finely divided metallic solder particles with a predetermined lesser quantity of a complementary dry finely divided particles of solder flux to form a homogenous mixture of particulate material wherein the homogenous mixture contains solder flux in the range of 0.25% to 30.0% by weight of the metallic solder particles,
   (b) placing a quantity of said homogenous mixture into a compression device having a predetermined shaped molding cavity, and
   (c) compressing said quantity of said homogenous mixture within said compression device to form a solid freestanding body of dry solderable material having a predetermined shape and outer surfaces wherein the solder flux is generally uniformly distributed throughout the solid body and along said outer surfaces thereof.

2. A solderable material comprising a solid freestanding shape retaining body, said body having outer surface portions and including a homogenous mixture of compressed particles of dry metallic solder particles and dry particles of solder flux, said particles of metallic solder and solder flux being of a size to be compacted into a freestanding body by the application of compressive pressure, said particles of solder flux being present in said body in an amount ranging from 0.25% to 30.0% by weight of said particles of solder metal and being generally uniformly distributed throughout said body so as to be readily available for fluxing along said outer surface portions thereof.

3. A method as claimed in claim 1 wherein said finely divided metallic solder and solder flux particles are in the form of a dry powder.

4. A method as claimed in claim 3, wherein the dry solder metal powder is of a particle size in the range of 80 to 300 American Standard Mesh.

5. A method as claimed in claim 3 wherein the dry powder flux is of a particle size in the range of 80 to 300 American Standard Mesh.

6. A method of forming a solder joint at an interface between solder sites of a predetermined shape located on opposite faces of solderable components comprising the steps of:
   (a) mixing a predetermined quantity of a solder metal in the form of dry finely divided metal particles with a predetermined quantity of a complementary solder flux in a dry particulate form to create a homogenous dry particulate mixture wherein the homogenous mixture contains solder flux in the range of 0.25% to 30.0% by weight of the metallic solder particles,
   (b) compressing a quantity of said homogenous mixture to form a dry solid freestanding body having a surface configuration matching said predetermined shape of said solder sites and wherein said particulate solder flux is generally uniformly distributed throughout the solid freestanding body so that a portion of said solder flux is available for fluxing along said surface and throughout said solid freestanding body,
   (c) locating said solid body at said interface, and
   (d) heating said solid body to effect soldering of said solderable components at said interface.

7. A method as claimed in claim 6, wherein the finely divided metal particles are in the form of a dry powder and the solder flux is in the form of a dry powder.

8. The solderable material of claim 2 wherein said solid freestanding body is in the form of a tubular sleeve.

9. The solderable material of claim 2 wherein said solid freestanding body is ring shaped.

* * * * *